US005631913A

United States Patent [19]

Maeda

[11] Patent Number: 5,631,913

[45] Date of Patent: May 20, 1997

[54] TEST CIRCUIT AND TEST METHOD OF INTEGRATED SEMICONDUCTOR DEVICE

[75] Inventor: Toshinori Maeda, Osaka, Japan

[73] Assignee: Matsushita Electric Industrial Co., Ltd., Osaka, Japan

[21] Appl. No.: 385,658

[22] Filed: Feb. 8, 1995

[30] Foreign Application Priority Data

Feb. 9, 1994 [JP] Japan .................................. 6-015030

[51] Int. Cl.$^6$ ...................................................... G06F 11/00

[52] U.S. Cl. ......................... 371/22.4; 371/22.5; 371/22.3

[58] Field of Search .................................. 371/22.4, 22.5, 371/25.1, 21.1, 27, 22.3, 22.6; 324/158 R, 73.1; 365/201

[56] References Cited

U.S. PATENT DOCUMENTS

| | | | |
|---|---|---|---|
| 4,601,034 | 3/1984 | Sridhar . | |
| 5,051,997 | 9/1991 | Sakashita et al. | 371/22.4 |
| 5,132,937 | 7/1992 | Tuda et al. | 365/201 |
| 5,175,494 | 12/1992 | Yoshimori | 324/158 R |
| 5,184,067 | 2/1993 | Nozuyama | 324/158 R |
| 5,412,665 | 5/1995 | Groudis et al. | 371/27 |
| 5,475,692 | 12/1995 | Hatano et al. | 371/21.2 |
| 5,488,615 | 1/1996 | Kunoff et al. | 371/22.4 |

*Primary Examiner*—Robert W. Beausoliel, Jr.
*Assistant Examiner*—Nadeem Iqbal
*Attorney, Agent, or Firm*—McDermott, Will & Emery

[57] ABSTRACT

In a test circuit of an integrated semiconductor device such as a memory, a parallel-input linear feedback shift register (LFSR) is used for both compressing data and comparing the obtained compressed value with an expected compressed value, thereby judging whether or not the integrated semiconductor device under test is normal. The parallel-input LFSR comprises a plurality of registers, a plurality of 2-input exclusive-OR gates placed in the stages previous to the respective registers mentioned above, and a feedback information generating means for generating feedback information from the output from the final-stage register and from the output from the register in a specified middle stage. In testing the integrated semiconductor device, the parallel-input LFSR compresses sequential sets of data from the integrated semiconductor device so as to obtain a compressed signature and then supplies the first input of the 2-input exclusive-OR gate placed in the leftmost position with the output from the final-stage register, while supplying the first inputs of the other exclusive-OR gates with the outputs from the registers in their respective previous stages. The second input of each of the exclusive-OR gates is supplied with an expected signature. Thus, the compressed value is compared with the expected compressed value at the respective exclusive-OR gates of the parallel-input LFSR.

24 Claims, 7 Drawing Sheets

TEST CIRCUIT AND TEST METHOD OF INTEGRATED SEMICONDUCTOR DEVICE

BACKGROUND OF THE INVENTION

The present invention relates to a test circuit and test method of an integrated semiconductor device. In particular, it relates to an improved test circuit and test method of an integrated semiconductor device for judging whether or not the integrated semiconductor device under test is normal.

In recent years, although advancing semiconductor technology has permitted higher integration and increasing miniaturization of large-capacity memories, testing of these memories with an improved efficiency in a shorter period of time has become a large problem. On the other hand, there have also been manufactured a large number of chips provided with embedded memories, such as a microprocessor and DSP. However, testing of these internal memories has also become a large problem, because it is difficult to test the internal memories by using only external terminals.

To solve the foregoing problems, there has conventionally been proposed a test method whereby a test circuit of an integrated semiconductor device is mounted on a chip so as to perform an automatic test. According to the method proposed, the automatic test is performed each time the power source is turned on. In each use, the result of the automatic test notifies the user whether the chip is normal or not, so that its maintenance and reliability in the market are improved advantageously.

There has also been proposed another automatic test method, which is a kind of compact test technique. The method uses a linear feedback shift register (hereinafter referred to as LFSR) in order to compress sequential outputs from an integrated semiconductor device such as a memory. Briefly, the LFSR comprises: a plurality of registers; a plurality of 2-input exclusive-OR gates placed in the stages previous to the above respective registers; and a feedback information generating means for generating feedback information from the output from the register in the final stage and from the output from the resister in a specified middle stage. Below, a description will be given to the automatic test method using the LFSR.

Initially, sequential sets of data are read from a memory such as a ROM, RAM, or PLA and inputted to a parallel-input LFSR so that the inputted information is compressed by the parallel-input LFSR, thereby obtaining the compressed value (signature) of sequential outputs from the parallel-input LFSR.

Subsequently, the signature obtained using the parallel-input LFSR is compared with expected signature inside the chip so as to judge whether or not the sequential outputs are proper. Alternatively, the obtained signature is scanned out by means of a scan path so that it is compared with the expected signature outside the chip, thereby judging whether or not the sequential outputs are proper and hence judging whether or not the memory under test is normal.

As disclosed in "Design and Test of the 80386" by Patrick P. Gelsinger (IEEE, Design & Test of Compt. vol. 4 no. 3, pp. 42–50 June 1987), e.g., the above method for judging whether or not the data is proper inside the chip can be implemented by inputting to an ALU the obtained signature and the expected signature that has been previously stored and storing the result of the exclusive-OR operation, which was carried out by the ALU, in a diagnostic register. In this case, if there is a match between the obtained signature and the expected signature, i.e., if the memory is normal, a zero is stored in the diagnostic register. If there is no match therebetween, i.e., if the memory is not normal, a value other than zero is stored in the diagnostic register.

However, the foregoing test circuit and test method of an integrated semiconductor device are unsatisfactory in terms of comparing the obtained signature with the expected signature inside the chip and judging whether or not the sequential outputs from a memory or an internal functional block are proper, because the following requirements are placed thereon:

(1) In addition to the parallel-input LFSR, a comparing means for comparing the compressed value of the sequential outputs with the expected signature is needed.

(2) If an ALU is used as the above comparing means, it becomes necessary to provide a storing means for previously storing the expected signature as well as to connect the parallel-input LFSR to the above ALU via a data bus. Consequently, a layout restriction occurs if a compact arrangement is to be obtained.

(3) If the foregoing configuration is adopted, the number of blocks to be controlled, such as the above comparing means and storing means, is increased so that complicated control using a microprogram becomes necessary.

The test circuit and test method of an integrated semiconductor device are also unsatisfactory in terms of comparing the obtained signature with the expected signature outside the chip and judging whether or not the sequential outputs from the memory are proper, because the following requirements, which render the test circuit and method of an integrated semiconductor device intricate and inflexible, are placed thereon:

(4) Although the expected signature for the chip to be tested is needed outside the chip, the user who cannot know the expected signature cannot use the test originally provided in the chip.

(5) Even if chips that are functionally identical are to be tested, it becomes necessary to prepare and control their respective expected signature, depending on the types of data written in their internal ROM or RAM, so that the data is compared with the corresponding expected signature.

SUMMARY OF THE INVENTION

An object of the present invention is to provide a test circuit and test method of an integrated semiconductor device using a parallel-input LFSR which receives and compresses parallel data, wherein a compressed signature obtained through compression is compared with an expected signature inside the chip, so that the integrated semiconductor device can be tested under simple control without necessitating the provision of a comparing means.

To attain the above object, the test circuit and test method of an integrated circuit of the present invention are constituted so that comparators originally provided in the test circuit, such as 2-input exclusive OR gates of the parallel-input LFSR, are used to compare the compressed signature obtained through compression by the parallel-input LFSR with the expected signature.

That is, a test circuit of an integrated semiconductor device of the present invention uses a compact test circuit which receives sequential sets of parallel data from the integrated semiconductor device and compresses the above inputted sequential sets of parallel data, and comprises: an expected compressed value storing means for storing an expected compressed value; a calculating circuit originally provided in the above test circuit; and an information collecting means for supplying, to the calculating circuit, a compressed value obtained through compression by the above compact test circuit and the expected compressed value stored in the above expected compressed value storing means, wherein the above calculating circuit originally provided in the test circuit also functions as a comparing means for comparing the above obtained compressed value with the expected compressed value.

Moreover, in the present invention, the above compact test circuit is composed of a parallel-input linear feedback shift register.

Furthermore, in the above test circuit of an integrated semiconductor device of the present invention, the parallel-input linear feedback shift register comprises: a plurality of registers; a plurality of 2-input exclusive-OR gates placed in the stages previous to the above respective registers; and a feedback information generating means for generating feedback information from the output from the register in the final stage and from the output from the register in a specified middle stage, each of the above registers receiving the output from the 2-input exclusive-OR gate in its previous stage, the first input of each of the 2-input exclusive-OR gates except the 2-input exclusive-OR gate placed in the stage previous to the register in the first stage being supplied with the output from the register in its previous stage, the first input of the 2-input exclusive-OR gate placed in the stage previous to the register in the first stage being supplied with the output from the above feedback information selecting means, the calculating circuit originally provided in the test circuit is composed of the plurality of 2-input exclusive-OR gates provided in the above parallel-input linear feedback shift register, the information collecting means consists of: a feedback information selecting means for selecting, based on a control signal, either of the output from the feedback information generating means and the output from the register in the final stage of the above parallel-input linear feedback shift register; and an input selecting means for selecting, based on the control signal, either of the parallel data and the expected compressed value stored in the expected compressed value storing means as data to be supplied to the second input of each of the registers of the above parallel-input linear feedback shift register.

On the other hand, a test method of an integrated semiconductor device of the present invention comprises the steps of: repeatedly compressing sequential sets of parallel data by reading sequential sets of data from the integrated semiconductor device in accordance with the same sequential addresses as supplied in generating an expected compressed value that has previously been obtained, while inputting the sequential sets of read data in parallel to the individual registers of a parallel-input linear feedback shift register, and shifting the sets of inputted data, so that the outputs from the individual registers at the time of compressing the final set of parallel data are obtained as the compressed value of the parallel data; then supplying the first input of a 2-input exclusive-OR gate placed in the stage previous to the register in the first stage with the output from the register in the final stage and supplying the first inputs of 2-input exclusive-OR gates placed in the stages previous to the respective registers except the register in the first stage with the outputs from the registers in their respective previous stages; inputting the expected compressed value to the second input of each of the 2-input exclusive-OR gates of the above parallel-input linear feedback shift register; and comparing the compressed value of the parallel data with the expected compressed value bit by bit correspondingly at the 2-input exclusive-OR gates and judging, based on the result of comparison, whether or not the integrated semiconductor device under test is normal.

In addition, in the above test method of an integrated semiconductor device of the present invention, while repeatedly compressing the sequential sets of data from the integrated semiconductor device by means of the parallel-input linear feedback shift register, each time the sequential sets of data are compressed, middle compression information consisting of the output from any one of the registers except the register in the final stage of the above parallel-input linear feedback shift register and of feedback information is stored or inputted, via a data bus, as test data for the integrated semiconductor device connected to the data bus.

In the test circuit and test method of an integrated semiconductor device thus constituted, sequential sets of data read or outputted from the integrated semiconductor device in the same order that the expected value (expected signature) was obtained are inputted as parallel data to the parallel-input LFSR. By shifting the parallel data inputted to the above parallel-data LFSR in synchronization with the clock, the compressed value of the sequential outputs is continually renewed in the registers of the parallel-input LFSR. At the time when all the sets of data are read and their repeated compression is completed, a desired compressed value (signature) is obtained in which the sequential outputs of data from the integrated semiconductor device are compressed.

To compare the above obtained signature with the expected signature, the two signatures are supplied to the calculating circuits originally provided in the test circuit. For example, the first input of the 2-input exclusive-OR circuit placed in the stage previous to the first-stage register of the parallel-input LFSR is supplied with the output from the final-stage register, while the first inputs of the 2-input exclusive-OR gates placed in the stages previous to the respective registers, except the first-stage register, are supplied with the outputs from the registers placed in their respective previous stages. On the other hand, the expected signature is inputted to the second input of each of the above 2-input exclusive-OR gates.

In this manner, since the compressed signature consisting of the outputs from all the registers is compared with the expected signature for comparison at the 2-input exclusive-OR gates of the parallel-input LFSR bit by bit correspondingly, the result of comparison is stored in the registers by performing shifting operation.

As a result, a match or mismatch between the compressed signature and the expected signature for comparison can be detected from the result of comparison stored in the registers, thereby judging whether or not the integrated semiconductor device (memory or internal functional block) is normal.

Hence, the comparison between the compressed signature and the expected signature can be performed by a calculating circuit originally provided in the test circuit, e.g., the same parallel-input LFSR used in data compression, thereby judging whether or not the integrated semiconductor device is normal.

In the test method of an integrated semiconductor device of the present invention, while testing the integrated semiconductor device by using the parallel-input LFSR, middle compression information from the parallel-input LFSR, i.e., the output from any register except the final-stage register and feedback information is stored, via a data bus, as test data in another integrated semiconductor device connected to the data bus (different from the above integrated semiconductor device under test), in parallel with the test. Hence, it is not necessary to connect, to the data bus, a data generating means for generating test data so that it is stored in the integrated semiconductor device. As a result, the data generating means and the cycle of storing the test data in the integrated semiconductor device are not required any more.

The above objects and novel features of the present invention will be more apparent from the reading of the following description in conjunction with the accompanying drawings.

BRIEF DESCRIPTION OF THE DRAWINGS

The accompanying drawings show the preferred embodiments of the present invention, in which.

DETAILED DESCRIPTION OF THE PREFERRED EMBODIMENTS

Below, the preferred embodiments of the present invention will be described with reference to the accompanying drawings, in which like numerals used in the following description designate like components throughout the drawings.

First Embodiment

Figure 1:
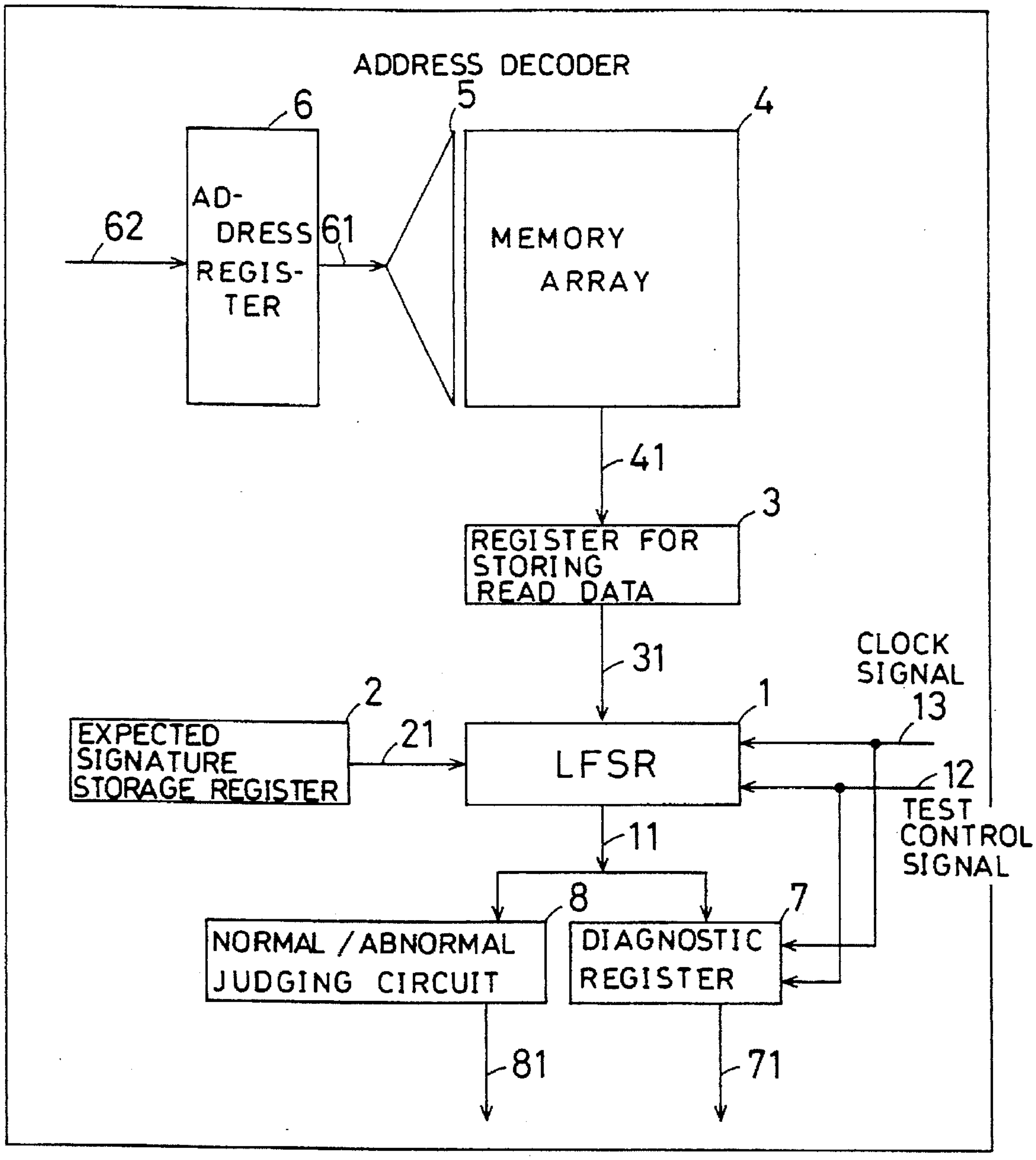
FIG. 1 is a schematic diagram showing the overall structure of a test circuit of an integrated semiconductor device in a first embodiment of the present invention.

FIG. 1 is a view showing the overall structure of a test circuit of an integrated semiconductor device in a first embodiment of the present invention.

In FIG. 1, a reference numeral 1 designates a parallel-input linear feedback shift register (hereinafter referred to as parallel-input LFSR) as a compact test circuit, 2 designates an expected signature storage register as an expected compressed value storing means for outputting an expected signature 21, and 3 designates a register for storing read data.

The above parallel-input LFSR 1 receives: the expected signature 21 outputted from the above expected signature storage register 2; read data 31 outputted from the register 3 for storing read data; a test control signal (control signal) 12 outputted from a control circuit 10; and a clock signal 13 and produces outputs 11 from four 2-input exclusive-OR gates XOR1 to XOR4 internally provided therein, which will be described later.

A reference numeral 4 designates a memory array. An address 61 supplied via an address input 62 and stored in an address register 6 is decoded by an address decoder S so that the content of a word corresponding to a word line outputted from the address decoder 5 is read as read data 41. The read data 41 is stored in the register 3 for storing read data and outputted as the read data 31 to the parallel-input LFSR 1.

A reference numeral 7 designates a diagnostic register for receiving: outputs 11 from the 2-input exclusive-OR gates, which will be described later; the test control signal 12; and the clock signal 18 and outputs its content to an output 71.

A reference numeral 8 designates a normal/abnormal judging circuit for receiving the output 11 from each of the 2-input exclusive-OR gates, which will be described later, judging whether or not the chip is normal, and outputting a judgment result 81. The entire circuit structure of FIG. 1 mentioned above is mounted on a single chip.

Figure 2:
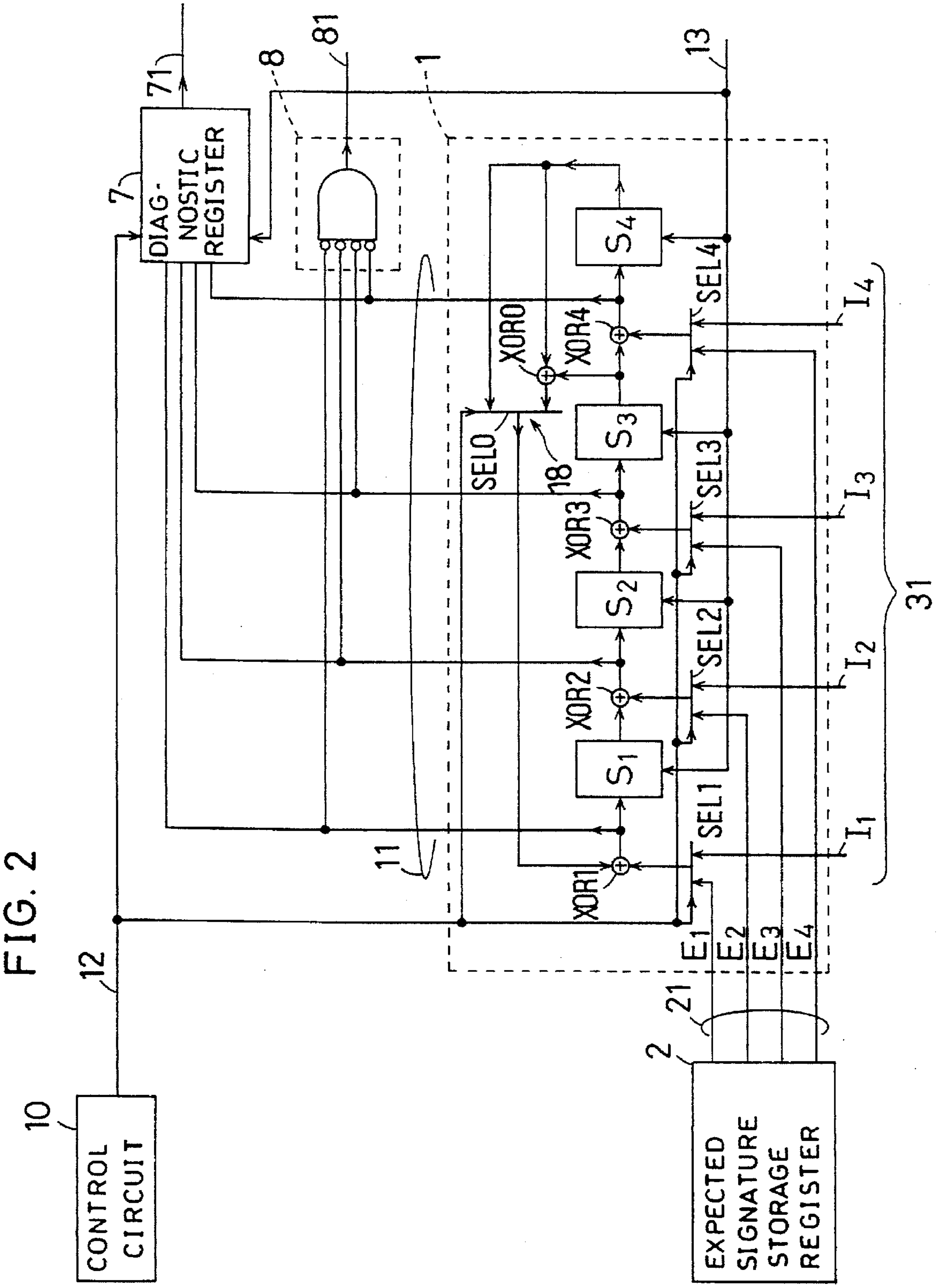
FIG. 2 is a view showing the structure of a specific test circuit of an integrated semiconductor device using a parallel-input LFSR in the first embodiment.

FIG. 2 is a view showing the structure of a specific test circuit for comparing compressed signature obtained through compression by the above parallel-input LFSR 1 with the expected signature stored in the above expected signature storage register 2 and judging whether or not the obtained compressed signature is proper.

In the drawing, the parallel-input LFSR 1 is composed of a 4-bit parallel-input LFSR comprising: four registers S1 to S4; the four 2-input exclusive-OR gates XOR1, XOR2, XOR3, and XOR4 placed in the stages previous to the respective registers S1 to S4; and a 2-input exclusive-OR gate XORO for receiving the output from the above register S4 in the final stage and the output from the register in a specified middle register (register S3 in the case of fourth order). The four 2-input exclusive-OR logic gates XOR1 to XOR4 of the above parallel-input LFSR 1 are composed of calculating circuits originally provided in the test circuit of the present embodiment. The output from the above 2-input exclusive-OR gate XORO serves as feedback information to the register S1 in the first stage. The 2-input exclusive-OR gate XORO constitutes a feedback information generating means.

The above parallel-input LFSR 1 is for implementing the following fourth-order primitive polynomial equation and obtaining the result.

$$g(X)=X^4+x+1$$

In the above parallel-input LFSR 1, data is shifted from left to right In synchronization with the clock signal. Hereinafter, the leftmost register S1 is termed the first-stage register, while the rightmost register S4 is termed the final-stage register.

The read data 31 (I1, I2, I3, I4) from the memory array 4, which is inputted to the parallel-input LFSR 1, or the expected signature 21 (E1, E2, E3, E4) in the expected signature storage register 2 are selected by input selectors SEL1, SEL2, SEL3, and SEL4 composed of 2-input multiplexers as input selecting means, respectively. The outputs of the input selectors SEL1, SEL2, SEL3, and SEL4 are connected to the second inputs of the above 2-input exclusive-OR gates XOR1 to XOR4, respectively. To the first inputs of the 2-input exclusive-OR gates XOR2 to XOR4 except the 2-input exclusive-OR gate XOR1 placed in the stage previous to the first-stage register S1 are connected the outputs of the registers S1 to S4 in their previous stages, respectively.

On the other hand, to the first input of the 2-input exclusive-OR gate XOR1 connected to the input of the first-stage register S1 is connected the output of the feedback information selector SEL0 as the feedback information selecting means. The feedback information selector SEL0 selects either one of the output from the final-stage register S4 and the output from the above 2-input exclusive-OR gate (feedback information generating means) XORO, based on the test control signal 12 and outputs the selected one.

The above input selectors SEL1 to SEL4 are also controlled by the test control signal 12 outputted from the control circuit 10. If the test control signal 12 is "0," the input selectors SEL1 to SEL4 select the read data 31 (I1, I2, I3, I4), respectively, while the feedback information selector SEL0 selects the feedback information. If the test control signal 12 is "1," the input selectors SEL1 to SEL4 select the expected signature 21 (E1, E2, E3, E4), respectively, while the feedback information selector SEL0 selects the output from the final-stage register S4.

The above feedback information selector SEL0 and the four input selectors SEL1 to SEL4 constitute an information collecting means 18 for supplying the compressed signature obtained through compression by the parallel-input LFSR 1 and the expected signature stored in the expected signature storage register 2 to the four 2-input exclusive-OR gates XOR1 to XOR4 (originally provided calculating circuits) of the parallel-input LFSR 1.

The diagnostic register 7 receives the outputs 11 from the 2-input exclusive-OR gates XOR1 to XOR4, the test control signal 12, and the clock 13, stores the result of testing the memory at the completion thereof by using the test control signal 12 as a write enable signal, and outputs its content.

The normal/abnormal judging circuit 8 also receives the outputs 11 from the 2-input exclusive-OR gates XOR1 to XOR4, judges whether or not the memory is normal at the completion of testing the memory, and outputs the memory normal/abnormal judgement result 81.

Figure 3:
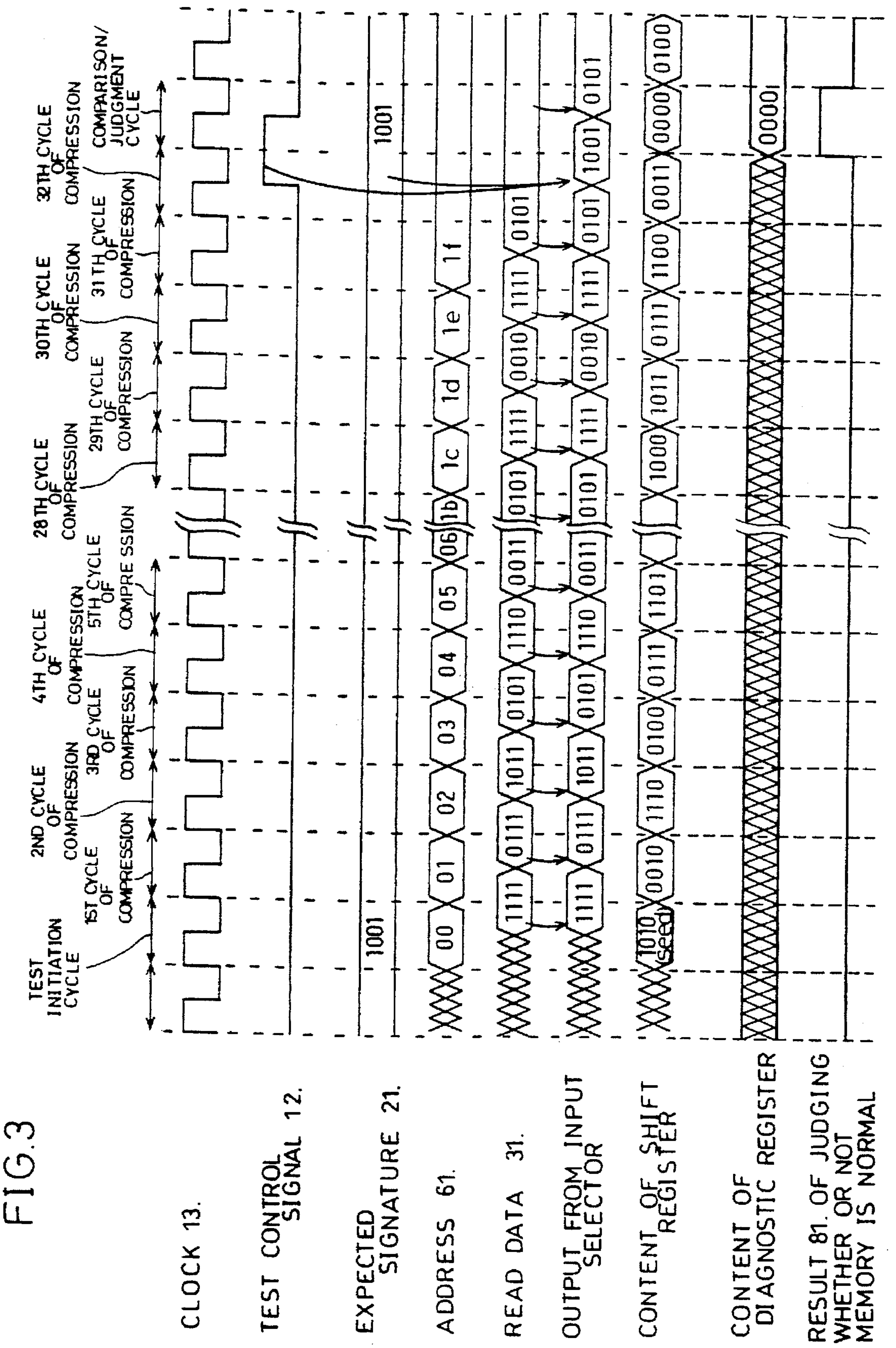
FIG. 3 is a timing chart illustrating the comparison between the compressed value of data and an expected signature in the first embodiment.

FIG. 3 is a timing chart illustrating the comparison between the compressed signature and the expected signature and the normal/abnormal judgment, which are carried out by the parallel-input LFSR 1 in the embodiment of the present invention.

Referring to FIGS. 1 to 3, a description will be given below to the test circuit of an integrated semiconductor device thus constituted. For simplicity, it is assumed in the following description that the memory under test (not shown) is of 32-word configuration and that each word consists of 4 bits.

The present embodiment is greatly different from the prior art in that the production of the compressed value and the comparison between the obtained compressed value (obtained signature) and the expected compressed value (expected signature) are carried out by using the same parallel-input LFSR 1.

Below, a description will be given to the production of the compressed value and comparison between the obtained compressed value and the expected compressed value in the test circuit. For simplicity, it is assumed that data has already been written in the memory.

The following table shows the contents of the registers S1 to S4 in a specified initial value (1010) of the parallel-input LFSR 1 and in the data read from the memory in the individual cycles of information compression. In the values of the registers S1 to S4, the alphanumericals enclosed in parentheses are hexadecimal representations. The content 0011 (corresponding to 3 in hexadecimal notation) of the registers S1 to S4 in the 32nd cycle, which is the final cycle of information compression, indicates the obtained signature from the sequential inputs.

| CYCLE (INITIAL VALUE OF LFSR) | INPUTTED DATA | CONTENT OF LFSR (hex) 1010 (A) | SEE REMARKS |
|---|---|---|---|
| 1 | 1111 | 0010 (2) | INFORMATION COMPRESSION CYCLE |
| 2 | 0111 | 1110 (E) | |
| 3 | 1011 | 0100 (4) | |
| 4 | 0101 | 0111 (7) | |
| 5 | 1110 | 1101 (D) | |
| 6 | 0011 | 1101 (D) | |
| 7 | 1111 | 0001 (1) | |
| 8 | 0101 | 1101 (D) | |
| 9 | 1011 | 0101 (5) | |
| 10 | 0110 | 1100 (C) | |
| 11 | 1111 | 1001 (9) | |
| 12 | 0001 | 1101 (D) | |
| 13 | 1111 | 0001 (1) | |
| 14 | 0111 | 1111 (F) | |
| 15 | 1010 | 1101 (D) | |
| 16 | 0101 | 1011 (B) | |
| 17 | 1111 | 1010 (A) | |
| 18 | 0011 | 1110 (E) | |
| 19 | 1111 | 0000 (0) | |
| 20 | 0100 | 0100 (4) | |
| 21 | 1011 | 1001 (9) | |
| 22 | 0111 | 1011 (B) | |
| 23 | 1111 | 1010 (A) | |
| 24 | 0001 | 1100 (C) | |
| 25 | 1110 | 1000 (8) | |
| 26 | 0111 | 0011 (3) | |
| 27 | 1011 | 1010 (A) | |
| 28 | 0101 | 1000 (8) | |
| 29 | 1111 | 1011 (B) | |
| 30 | 0010 | 0111 (7) | |
| 31 | 1111 | 1100 (C) | |
| 32 | 0101 | 0011 (3) | |
| 33 | 1001 | 0000 (0) | JUDGMENT CYCLE |

In the foregoing table, the contents of the inputted data (data read from the memory) and of the registers S1 to S4 are written in the order of I1, I2, I3, I4/S1, S2, S3, S4 from left to right.

First, in the test initiation cycle, the first address 61 read from the memory is supplied so as to initiate the reading of data from the memory. The read data 1111 (F in hexadecimal notation) is stored in the register 3 for storing read data and then outputted to the parallel-input LFSR 1. In parallel with that, an initial value (in this example, 1010 corresponding to A in hexadecimal notation) is set in the parallel-input LFSR 1. Subsequently, in the first cycle of compression, the test control signal 12 is "0," which indicates that the input selectors have selected the read data 31 (I1, I2, I3, 14) and that the feedback information selector SEL0 has selected the feedback information. In this case, the read data 1111 is selected by the input selectors SEL1 to SEL4 and compressed by the parallel-input LFSR 1. The compressed value becomes 0010 (2 in hexadecimal notation). In this cycle also, the address 61 newly read from the memory is supplied, which indicates that data is being read from the memory. The read data 0111 (7 in hexadecimal notation) is stored in the register 3 for storing read data and then outputted to the parallel-input LFSR 1.

Similarly, in the second cycle of compression, the read data 0111 is selected by the input selector SEL1 to SEL4 and compressed by the parallel-input LFSR 1. In this case, the compressed value is 1110 (E in hexadecimal notation). In this cycle also, the address 61 newly read from the memory is supplied, which indicates that sequential sets of data are being read from the memory. The read data 1011 (B in hexadecimal notation) is stored in the register 3 for storing read data and outputted to the parallel-input LFSR 1. In the 1st to 32nd cycles, only read addresses to the memory are different and the same operation is performed. If all the sets of data read from the memory are proper, the obtained signature can be provided in the 32nd cycle of compression, which is 0011 (3 in hexadecimal notation).

When the compression cycles were completed (up to the 32nd cycle), the 33rd cycle serves as the judgment cycle. Since the test control signal 12 became 1 in synchronization with an inverted clock in the previous cycle (the final cycle of compression), the input selectors SEL1 to SEL4 select the expected signature 21 (E1, E2, E3, E4), while the feedback information selector SEL0 selects the output from the final-stage register S4. That is, in the judgment cycle, the outputs from the registers in the previous stages (the final-stage register S4 for the first-stage register S1) are supplied to the first inputs of all the 2-input exclusive-OR gates XOR1 to XOR4, while the expected signature 21 (E1, E2, E4, E4) is supplied to the second inputs thereof, so that the exclusive-OR operation (comparison) is carried out between each of the values stored in the registers S1 to S4 in respective stages and the expected signature 21 stored in the expected signature storage register 2.

However, since the expected signature En and the output from the previous-stage register (Sn−1) (the final stage if n =1) are inputted to the 2-input exclusive-OR gate XORn which is connected to the input of the n-stage (n=1 to 4) register Sn, data obtained by rotating the expected signature 0011 (3 in hexadecimal notation) to the right by 1 bit (or by rotating the expected signature 0011 to the left by 3 bits) is stored in the expected signature storage register 2. The data stored in the present embodiment is 1001 (9 in hexadecimal notation).

Hence, if there is a match between the corresponding bits of the compressed signature and of the expected signature, "0" is outputted from each of the above 2-input exclusive-OR gates XOR1 to XOR4. If there is no match therebetween, "1" is outputted from each of the above 2-input exclusive-OR gates XOR1 to XOR4, so that the result of comparison is stored in the subsequent registers. The result of comparison is inputted as the outputs 11 from the 2-input exclusive-OR gates XOR1 to XOR4 to the diagnostic register 7 and to the normal/abnormal judging circuit 8.

The diagnostic register 7 stores, using the test control signal 12 as the write enable signal, the outputs 11 from the 2-input exclusive-OR gates XOR1 to XOR4 in the current comparison/judgment cycle as the result of judgment and outputs it to the output 71. The normal/abnormal judging circuit 8 outputs "1" indicating that the memory is normal if all the outputs 11 from the 2-input exclusive-OR gates have the value of 0 in the comparison/judgment cycle. On the other hand, the normal/abnormal judging circuit 8 outputs "0" indicating that the memory is not normal if at least one of the outputs from the 2-input exclusive-OR gates has the value of 1. The normal/abnormal judging circuit 8 can be implemented by a 4-input NOR gate which receives the outputs 11 from the 2-input exclusive-OR gates. However, since all the outputs 11 from the 2-input exclusive-OR gates, i.e., all the registers in respective stages have the value of 0 in the 19th cycle of compression as shown in Table 1, the result 81 of judging the normality or abnormality of the memory is valid only in the comparison/judgement cycle.

Thus, in contrast to the prior art which compares the obtained compressed value with the expected compressed value by means of an ALU and hence requires complicated control using a microprogram, the present embodiment can compare the compressed signature with the expected signature by means of the parallel-input LFSR 1, which also compressed data, by simply supplying the test control signal in the comparison/judgment cycle. Consequently, there is no need for providing an additional comparator for performing comparison, so that a test circuit of a memory which can easily be mounted on a single chip can be implemented by merely providing additional hardware (feedback information SEL0 and input selectors SEL1 to SEL4).

Although the present embodiment has compressed data by inputting the output S1 from the register 3 for storing read data to the parallel-input LFSR 1, if a control signal and additional hardware is provided in the parallel-input LFSR 1, the parallel-input LFSR 1 can be used as a register for storing read data in normal operation, while it can be used as a parallel-input LFSR in testing a memory, so that the number of hardware items can be reduced.

Although the present embodiment has required the expected signature storage register 2 to store data obtained by rotating the expected signature to the right by 1 bit (or by rotating the expected signature to the left by 3 bits), the same effect can be obtained if the input selectors SEL1 to SEL4 are constituted as rotators which rotate the expected signature outputted from the expected signature storage memory 2 to the right by 1 bit (or by rotating the expected signature to the left by 3 bits) without performing any operation with respect to the expected signature to be stored.

Although the present embodiment has set the initial value of the parallel-input LFSR 1 to 1010 (A in hexadecimal notation), the value is not limited thereto. It can be set to any desired value. In this case, a test can be performed properly by storing the expected signature which corresponds to the initial value.

Although the present embodiment has tested the memory by connecting the parallel-input LFSR 1 to the memory, an internal functional block can also be tested similarly by connecting the output of the internal functional block to the parallel LFSR 1, supplying the same sequential inputs as supplied in obtaining the expected compressed value, compressing the sequential outputs corresponding to the sequential inputs, and comparing the obtained compressed value with the expected compressed value.

Second Embodiment

Next, a description will be given to a second embodiment, specifically to a test circuit of a plurality of integrated semiconductor devices which are connected in common to a single data bus with reference to FIG. 4.

Figure 4:
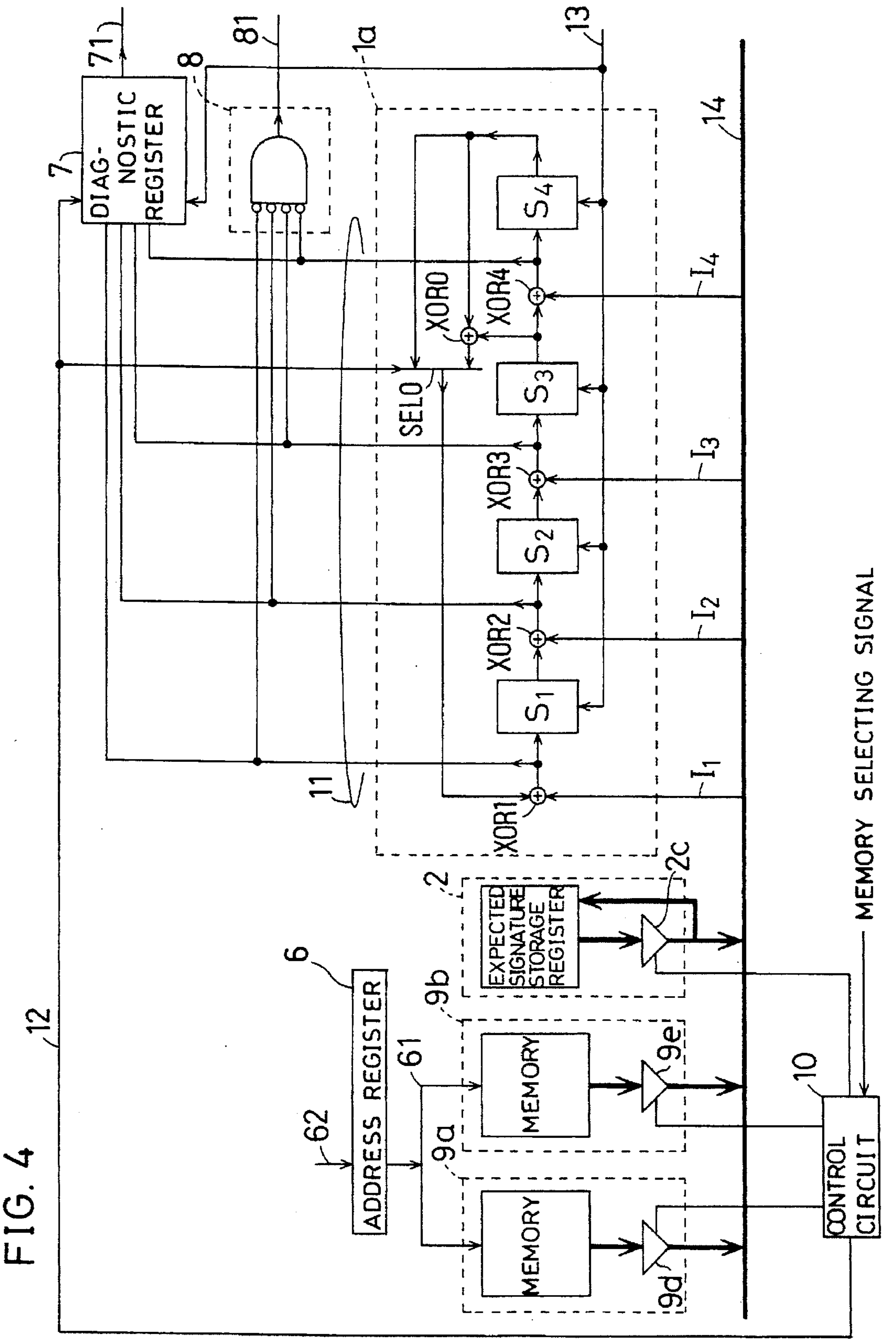
FIG. 4 is a view showing the structure of a specific test circuit of an integrated semiconductor device in a second embodiment of the present invention.

FIG. 4 is a view showing the overall structure of the test circuit of an integrated semiconductor device in the second embodiment of the present invention. FIG. 4 is different from FIG. 1 in that: a data bus 14 is provided, which is connected directly, as the input to the parallel-input LFSR 1*a*, to the second inputs of the 2-input exclusive-OR gates XOR1 to XOR4 without the interposition of the input selectors SEL1 to SEL4 shown in FIG. 1; to the data bus 14 are connected first second memories 9*a* and 9*b* as integrated semiconductor devices under test and the expected signature storage register 2; the memories 9*a* and 9*b* and expected signature storage register 2 are disposed output buffers 9*d*, 9*e*, and 2*c*, respectively, that the output buffers 9*d*, 9*e*, and 2*c* output the respective contents of the memories 9*a* and 9*b* and expected signature storage register 2 to the above data bus 14; and a control circuit 10 outputs the test control signal 12, while selectively controlling, based on a memory selecting signal inputted from the outside, the above output buffers 9*d*, 9*e*, and 2*c* so that any one of them outputs data onto the data bus 14. The expected signature stored in the expected signature storage register 2 has preliminarily been stored or otherwise inputted from the outside via the data bus 14.

In other words, the input selecting means in the present embodiment is constituted by the control circuit 10 for controlling the output buffers 9*d*, 9*e*, and 2*a* which are provided in the memories 9*a* and 9*b* and expected signature storage register, not by the input selectors SEL1 to SEL4 of FIG. 1. All the components of the test circuit of FIG. 4 are disposed on the same substrate.

Next, a description will be given to the compression of data, the comparison of the compressed value with the expected signature, and to the normal/abnormal judgment.

For simplicity, it is assumed that the memories 9*a* and 9*b* are connected to the same data bus and have the same structure and the same capacity, as the data array of a two-way set associative cache memory. It is also assumed that the same data is written in the memories 9*a* and 9*b* and that the expected signature when the data is read in a specified order is stored in the expected signature storage register 2.

First, a parallel-input LFSR 1*a* is initialized (setting of initial value) and then data is read from the memory 9*a* and compressed. In the compression cycle for the first memory 9*a*, the control circuit 10 outputs an output enable signal to the data bus 14 so that the data read from the first memory 9*a* is outputted onto the data bus 14. The parallel-input LFSR 1*a* receives and compresses the data on the data bus 14. The order of reading sets of data from the first memory 9*a* is the same as that of reading sets of data in obtaining the expected signature. The compression cycle is continued until the reading of all the words is completed.

When the compression cycle for the first memory 9*a* was completed, the parallel-input LFSR 1*a* obtains a desired signature.

The process then goes on to the comparison/judgment cycle for the first memory 9*a*. Since the test control signal 12 became 1 in synchronization with the inverted clock in the latter part of the previous cycle (final cycle of compression), the feedback information selector SEL0 selects the output from the final-stage register S4. The control circuit 10 outputs an output enable signal to the expected signature storage register 2 so that the expected signature is outputted onto the data bus 14.

The data on the data bus 14 is supplied to the second inputs of the 2-input exclusive-OR logic gates XOR1 to XOR4 of the parallel-input LFSR 1*a*. In the 2-input exclusive-OR gates XOR1 to XOR4, the exclusive-OR operation (comparison) is carried out between each of the values stored in the registers S1 to S4 and the expected signature 21 stored in the expected signature storage memory 2, so that the result of comparison is outputted to the outputs 11 of the 2-input exclusive-OR gates XOR1 to XOR4 and then inputted to the diagnostic register 7 and to the normal/abnormal judging circuit 8.

The diagnostic register 7 stores the outputs 11 from the 2-input exclusive-OR gates XOR1 to XOR4, obtained in the comparison/judgment cycle, in a field allocated to the result of judging the first memory 9*a* and then outputs it to the output 71.

If all the outputs 11 from the 2-input exclusive-OR logic gates XOR1 to XOR4 have the value of 0 in the judgment cycle, the normal/abnormal judging circuit 8 outputs "1" indicating that the first memory 9*a* is normal. If at least one of the outputs 11 has the value of 0, the normal/abnormal judging circuit 8 outputs "0" indicating that the first memory 9*a* is not normal.

Next, data is read from the second memory 9*b* so that the read data is compressed. In this case also, it is necessary to initialize the parallel-input LFSR 1*a*, similarly to the case with the first memory 9*a*. Subsequently, data is read from the second memory 9*b* so that the read data is compressed. The compression cycle for the second memory 9*b* is different from that for the first memory 9*a* only in that the control circuit 10 outputs the output enable signal to the second memory 9*b* so that the data read from the second memory 9*b* is outputted onto the data bus 14. The order of reading data from the second memory 9*b*, which is indicated by the address 62, is the same as that of reading data from the first memory 9*a*. If the memories 9*a* and 9*b* are normal, the same data is read therefrom.

The parallel-input LFSR 1*a* receives and compresses data on the data bus 14. The compression cycle is continued until the reading of all the words is completed.

When the compression cycle for the second memory 9*b* was completed, the parallel-input LFSR 1*a* obtains a desired signature. Here, since the same data is written in the first and second memories 9*a* and 9*b* and the order of reading data therefrom is the same, if proper data has been read, it follows that the same signature is obtained for the memories 9*a* and 9*b*.

The process then goes on to the comparison/judgment cycle for the second memory 9*b*. Since the test control signal 12 became 1 in synchronization with the inverted clock in the latter part of the previous cycle (final cycle of compression) and the expected signature 21 outputted from the output signature storage register 2 is supplied to the data bus 14 and inputted to the parallel-input LFSR 1*a*, similarly to the case with the first memory 9*a*, the compressed signature is compared with the expected signature 21.

The diagnostic register 7 stores the outputs 11 from the 2-input exclusive-OR logic gates XOR1 to XOR4 in the comparison/judgment cycle in the field allocated to the result of judging whether or not the second memory 9*b* is normal and outputs its content to the output 71.

If all the outputs 11 from the 2-input exclusive-OR gates XOR1 to XOR4 have the value of 0 in the judgment cycle, the normal/abnormal judging circuit 8 outputs "1" indicating that the second memory 9*b* is normal, similarly to the case with the first memory 9*a*. If at least one of the outputs 11 has the value of 0, the second memory 9*b* outputs "0" indicating that the second memory 9*b* is not normal.

Thus, by executing the cycle of data compression and the cycle of comparison/judgment with respect to each of the memories 9*a* and 9*b*, tests can be performed with respect to the first and second memories 9*a* and 9*b* connected in common to the single data bus 14.

Although it has been assumed that the memories 9*a* and 9*b* have the same structure and the same memory capacity, they may have different memory capacities or different sets of data may be written therein. Moreover, two or more memories may be connected to the data bus 14. In these cases, since signatures obtained by compressing data for the individual memories are different from each other, tests can be performed on the memories of different structures which are connected to the data bus if the expected signatures corresponding to the individual memories are provided or if the signatures are obtained by reading data from all the memories and compared with the expected signature. In the case where the expected signature storage register 2 stores a plurality of expected signature, it becomes necessary to input the addresses (not shown) outputted from the control circuit 10 to the storage register 2.

Third Embodiment

Figure 5:
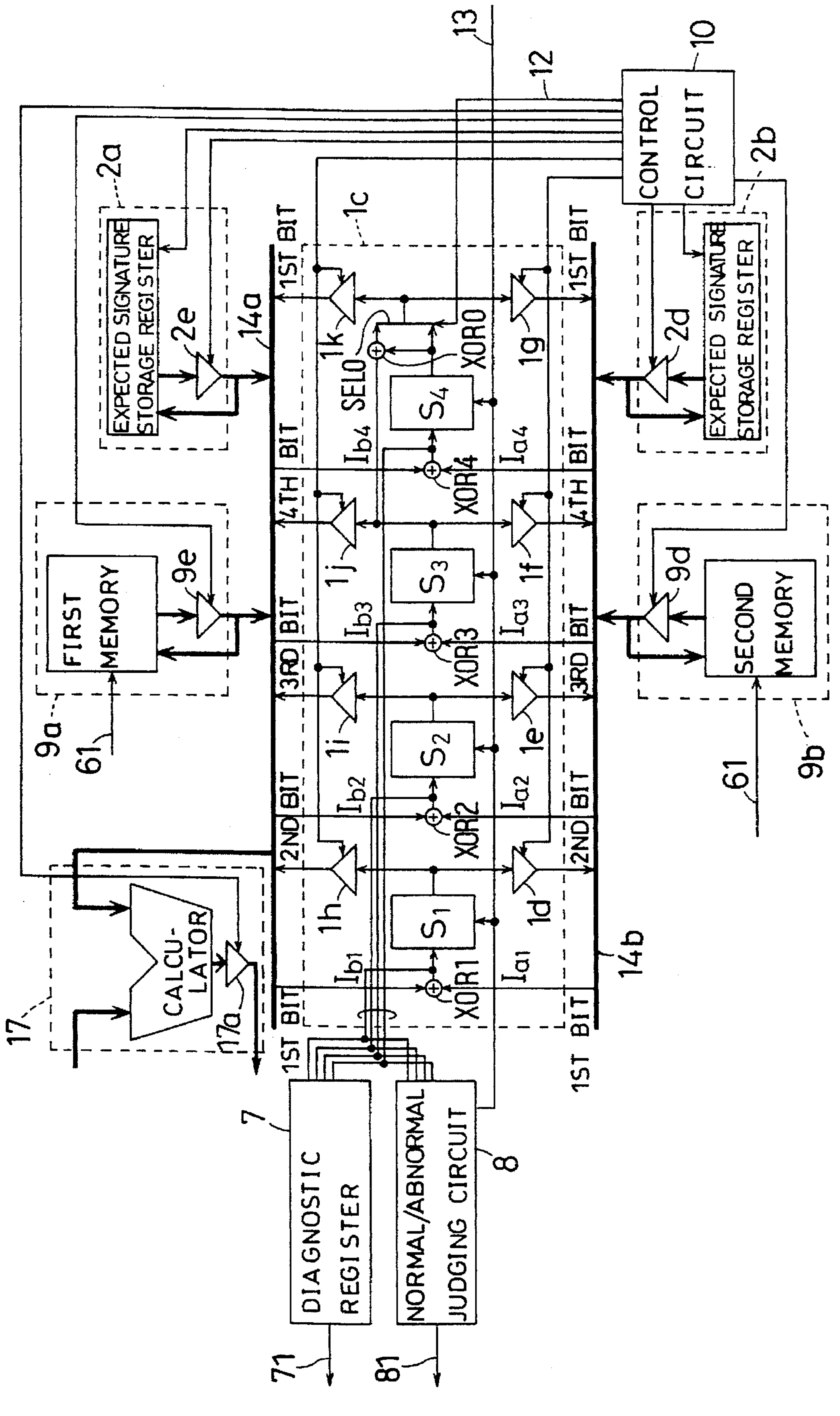
FIG. 5 is a view showing the structure of a specific test circuit of an integrated semiconductor device in a third embodiment of the present invention.

FIG. 5 shows a test circuit of an integrated semiconductor device according to a third embodiment of the present invention. In the present embodiment, two data buses are provided so that a single or a plurality of integrated semiconductor devices, specifically calculators (internal functional blocks) or memories, are connected to each of the data buses. Below, a description will be given to the structure of the test circuit of FIG. 5. The description of the same components as used in the test circuit of FIG. 4 will be omitted by providing the same reference numerals. A description will be given only to new components.

In FIG. 5, reference numerals 14*a* and 14*b* designate data buses. The first inputs of the 2-input exclusive-OR gates XOR1 to XOR4 of the parallel-input LFSR 1*c* are connected to the data bus 14*a*, while the second inputs thereof are connected to the data bus 14*b*. The outputs of the three registers S1 to S3 except the final-stage register S4 of the parallel-input LFSR 1*c* and the output of the feedback information selector SEL0 are connected to the above two data buses 14*a* and 14*b* via the output buffers 1*d*, 1*e*, 1*f*, 1*g*, 1*h*, 1*i*, and 1*k*. To the above data bus 14*a* are connected: the first memory 9*a* as a memory under test; a calculator (internal functional block) 17 as an integrated semiconductor device under test, such as a multiplier or an adder; and an expected signature storage register 2*a*. To the data bus 14*b* are similarly connected: the second memory 9*b* as an integrated semiconductor device under test; and an expected signature storage register 2*b*. The expected signature storage registers 2*a* and 2*b* have the output buffers 2*e* and 2*d*, respectively. The control circuit 10 controls the output buffers 1*d* to 1*k*, 2*d*, 2*e*, 9*d*, and 9*e* so that only one set of data can be outputted onto each of the data buses 14*a* and 14*b*, while outputting the test control signal 12. The control circuit 10 also controls the expected signature storage register 2*a* connected to the data bus 14*b* so that two expected signatures to be stored in the expected signature storage register 2*a*, i.e., the expected signature for the memory 9*a* and the expected signature for the calculator 17, are stored at their intended addresses, while controlling the expected signature storage register 2*b* connected to the data bus 14*b* so that the expected signature for the memory 9*a* to be stored in the expected signature storage register 2*b* is stored at an intended address. All the components of the test circuit of FIG. 5 are disposed on the same substrate.

With the above structure, if the first memory 9*a* is to be tested by the test circuit of FIG. 5, the individual bits of 4-bit data read from the first memory 9*a* are inputted to the first inputs of the 2-input exclusive-OR gates XOR1 to XOR4 of the parallel-input LFSR 1*c* via the data bus 14*a*, while the individual outputs from the three registers S1 to S3 except the final-stage register S4 and the output from the feedback information selector SEL0, i.e., the internal information of the parallel-input LFSR 1*c*, are inputted to the second inputs of the exclusive-OR gates XOR1 to XOR4 in the subsequent stage via the data bus 14*b*, thereby enabling compression of data.

Figure 6:
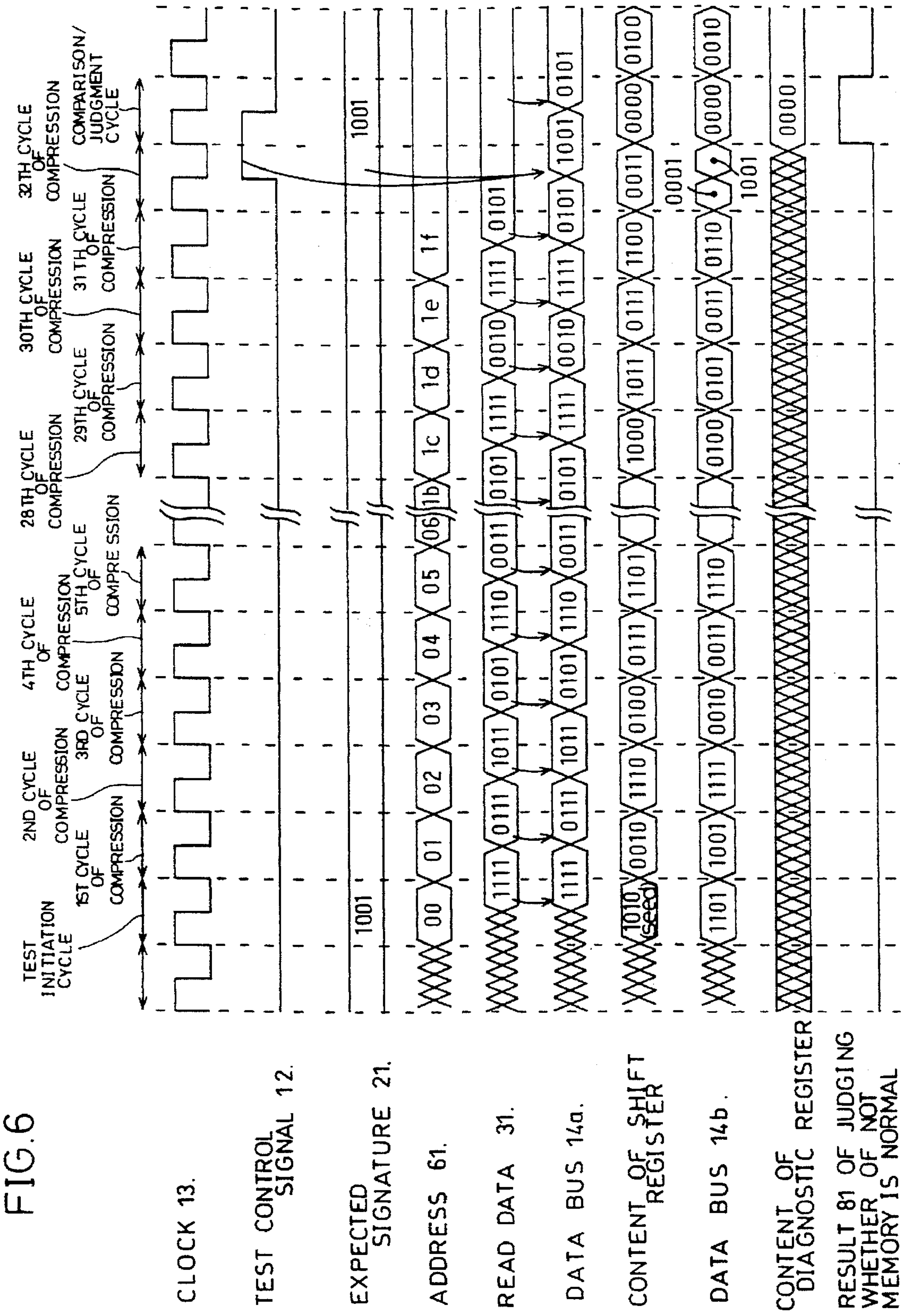
FIG. 6 is a timing chart illustrating the comparison between the compressed value of data and the expected signature in the third embodiment.

FIG. 6 is a timing chart illustrating the comparison between the compressed signature and the expected signature and the normal/abnormal judgment performed by the parallel-input LFSR 1*c* in the present embodiment. Below, a description will be given to the tests on the memories performed by the test circuit of FIG. 5 with reference to FIGS. 5 and 6. To simplify the description, it is assumed that the first and second memories 9*a* and 9*b* have the same structure, the same memory capacity, and the same data written therein. The control signals outputted from the control circuit 10 to the memories 9*a* and 9*b*, to the expected signature storage registers 2*a* and 2*b*, and to the parallel-input LFSR 1*c* in the test initiation cycle, in the compression cycle, and in the comparison/judgment cycle are shown in the following table.

TABLE 2

| | SIGNAL TO OUTPUT BUFFER 1d to 1g OF LFSR 1c | SIGNAL TO OUTPUT BUFFER 1h to 1k OF LFSR 1c | SIGNAL TO OUTPUT BUFFER 9e OF FIRST MEMORY 9a | SIGNAL TO OUTPUT BUFFER 9d OF SECOND MEMORY 9b | SIGNAL TO OUTPUT BUFFER 2e OF FIRST EXPECTED SIGNATURE STORAGE REGISTER 2 | SIGNAL TO OUTPUT BUFFER 2d OF SECOND EXPECTED SIGNATURE STORAGE REGISTER 2 |
|---|---|---|---|---|---|---|
| TEST INITIATION CYCLE FOR MEMORY 9a | 1 | 0 | 1 | 0 | 0 | 0 |
| COMPRESSION CYCLE FOR MEMORY 9a | 1 | 0 | 1 | 0 | 0 | 0 |
| COMPARISON CYCLE FOR MEMORY 9a | 1 | 0 | 0 | 0 | 1 | 0 |
| TEST INITIATION CYCLE FOR MEMORY 9b | 0 | 1 | 0 | 1 | 0 | 0 |
| COMPRESSION CYCLE FOR MEMORY 9b | 0 | 1 | 0 | 1 | 0 | 0 |
| COMPARISON CYCLE FOR MEMORY 9b | 0 | 1 | 0 | 0 | 0 | 1 |

First, the parallel-input LFSR 1*c* is initialized, i.e., an initial value is set. Subsequently, in the compression cycle for the data from the first memory 9*a*, the control circuit 10 outputs the output enable signal to the output buffer 9*e* of the first memory 9*a*, so that the data read from the first memory 9*a* is outputted onto the data bus 14*a*. On the other hand, the control circuit 10 outputs the output enable signal to the four output buffers 1*d* to 1*g* of the parallel-input LFSR 1*c*, so that the internal information of the parallel-input LFSR 1*c*, i.e., the outputs from the registers S1 to S3 and the output from the feedback information selector SEL0 are outputted onto the data bus 14*b*. Since the test control signal 12 is "0" in the test initiation cycle and in the compression cycle, which indicates that the feedback information selector SEL0 has selected the output from the 2-input exclusive-OR gate XORO as the feedback information in the above parallel-input LFSR 1*c*, the output from the 2-input exclusive-OR gate XORO is inputted to the first bit on the data bus 14*b*, while the outputs from the registers S1, S2, and S3 are inputted to the second, third, and fourth bits thereon, respectively.

The first inputs of the 2-input exclusive-OR gates XOR1 to XOR4 of the parallel-input LFSR 1*c* receive sets of data on the data bus 14*a*, i.e., sees of data Ib1 to Ib4 read from the first memory 9*a*, while the second inputs thereof receive data on the data bus 14*b*, i.e., the internal information of the parallel-input input LFSR 1*c*, so that the exclusive-OR operation is performed therebetween in the exclusive-OR gates XOR1 to XOR4. The individual results of the operation are stored in the registers S1 to S4, respectively, in synchronization with the clock 13. In this manner, the data read from the first memory 9*a* is compressed.

The order of reading the sets of data from the first memory 9*a* is the same as that of reading the sets of data in obtaining the expected signature. The compression cycle is continued until all the sets of data are read from the first memory 9*a*. When the reading and compression of the final set of data was completed, the parallel-input LFSR 1*c* obtains a desired compressed signature.

Next, in the comparison/judgment cycle in which the compressed signature is compared with the expected signature for the first memory 9*a*, since the test control signal 12 became 1 in synchronization with the inverted clock in the latter part of the final cycle of compression, it follows that the feedback information selector SEL0 has selected the output from the final-stage register S4. Consequently, the parallel-input LFSR 1*c* outputs the outputs from the registers S1 to S4 in respective stages, i.e., the compressed signature obtained, onto the data bus 14*b*. On the other hand, since the control circuit 10 outputs the output enable signal to the expected signature storage register 2*a*, the expected signature stored in the expected signature storage register 2*a* is outputted onto the data bus 14*a*.

The first inputs of the 2-input exclusive-OR gates XOR1 to XOR4 of the parallel-input LFSR 1*c* receive data on the data bus 14*a*, i.e., the expected signature, while the second inputs thereof receive data on the data bus 14*b*, i.e., the compressed signature, so that the exclusive-OR operation therebetween is carried out at each of the exclusive-OR gates XOR1 to XOR4. The individual results of the operation are outputted to the respective outputs 11 of the exclusive-OR gates XOR1 to XOR4 and then inputted to the diagnostic register 7 and to the normal/abnormal judging circuit 8.

The above diagnostic register 7 stores the respective outputs 11 from the 2-input exclusive-OR gates XOR1 to XOR4 obtained in the above comparison/judgment cycle in the field allocated as a place for storing the result of judging the first memory 9*a*, while outputting the result of judgment to the outside. If all the outputs 11 from the 2-input exclusive-OR gates XOR1 to XOR4 obtained in the above comparison/judgment cycle have the value of 0, the normal/abnormal judging circuit 8 outputs "1," indicating that the first memory 9*a* is normal. If at least one of the outputs 11 has the value of 1, the normal/abnormal judging circuit 8 outputs "0," indicating that the first memory 9*a* is not normal.

After that, sets of data Ia1 to Ia4 are read from the second memory 9*b* so that the read data is compressed and the resulting compressed signature is compared with the expected signature for judgment. Since these procedures are the same as those performed in the test on the above first memory 9*a*, the description thereof will be omitted.

Although the present embodiment has assumed that the two memories 9*a* and 9*b* had the same structure and the same capacity in the description given thus far, the two memories 9*a* and 9*b* may have different capacities and different sets of data written therein. It is also possible to connect a plurality of memories to each of the data bus 14*a* and 14*b*. In the case where different sets of data are written in the memories, different expected signatures are stored in the expected signature storage registers 2*a* and 2*b* corresponding to the memories. In the case where a plurality of expected signatures are stored in each of the expected signature storage registers 2*a* and 2*b*, the control circuit 10 should generate an address signal for selecting among the expected signatures so that the signal is inputted to the expected signature storage registers 2*a* and 2*b*. In the case where only one expected signature storage register is provided, sequential sets of data are read from the plurality of memories provided, so that the compressed signature of the sequential outputs is obtained and that the resulting compressed signature is compared with the expected signature.

Next, a description will be given to the characteristic of the present embodiment. In testing the first memory 9*a* in the present embodiment, e.g., "1101," "1001," "1111," "0010," . . . , which are the internal information of the parallel-input LFSR 1*c* (i.e., different sets of data for different cycles), are sequentially outputted to the data bus 14*b*, starting from the test initiation cycle, so that the sets of data are sequentially written in the second memory 9*b* connected to the above data bus 14*b* (in testing the second memory 9*b*, on the other hand, the sets of internal information of the parallel-input LFSR 1*c* are sequentially written in the first memory 9*a* via the data bus 14*a*, while they are inputted as operands to the calculator 17. Therefore, it is not necessary to connect, to the data bus 14*b*, the data generating means for writing data in the second memory 9*b* prior to testing the second memory 9*b*. Since it is assumed in the present embodiment that the first and second memories 9*a* and 9*b* have the same structure and the same capacity, data can be written in the second memory 9*b*, while the data read from the first memory 9*a* is compressed simultaneously.

In addition to the tests performed on the first and second memories 9*a* and 9*b* using the parallel-input LFSR 1*c*, if the memories 9*a* and 9*b* have the same capacity and the same data written at the addresses corresponding to each other, the data stored in the first memory 9*a* and the data stored in the second memory 9*b* is inputted to the 2-input exclusive-OR gates XOR1 to XOR4 of the parallel-input LFSR 1*c* via the respective data buses 14*a* and 14*b*, so that the two sets of data inputted above are compared at the 2-input exclusive gates XOR1 to XOR4. If there is a match between the two sets of data as a result of comparison, it follows that all the outputs 11 from the 2-input exclusive-OR gates XOR1 to XOR4 have the value of 1. Consequently, the normal/abnormal judging circuit 8 outputs "1," which indicates that each of the memories 9a and 9b is normal. If there is a mismatch between the two sets of data, it follows that at least one of the outputs 11 from the 2-input exclusive-OR gates XOR1 to XOR4 has the value of 1. Consequently, the normal/abnormal judging circuit 8 outputs "0," which indicates that either of the memories 9a and 9b is not normal or that each of the memories 9a and 9b is not normal. Thus, the memories 9a and 9b are judged to be normal or not based on the value of the output from the normal/ abnormal judging circuit 8. Therefore, it is possible to test the two memories 9a and 9b for normality by separately reading data from the memory 9a and data from the memory 9b at the same time and by comparing the two sets of read data with each other at the 2-input exclusive-OR gates XOR1 to XOR4 of the parallel-input LFSR 1c.

Fourth Embodiment

Figure 7:
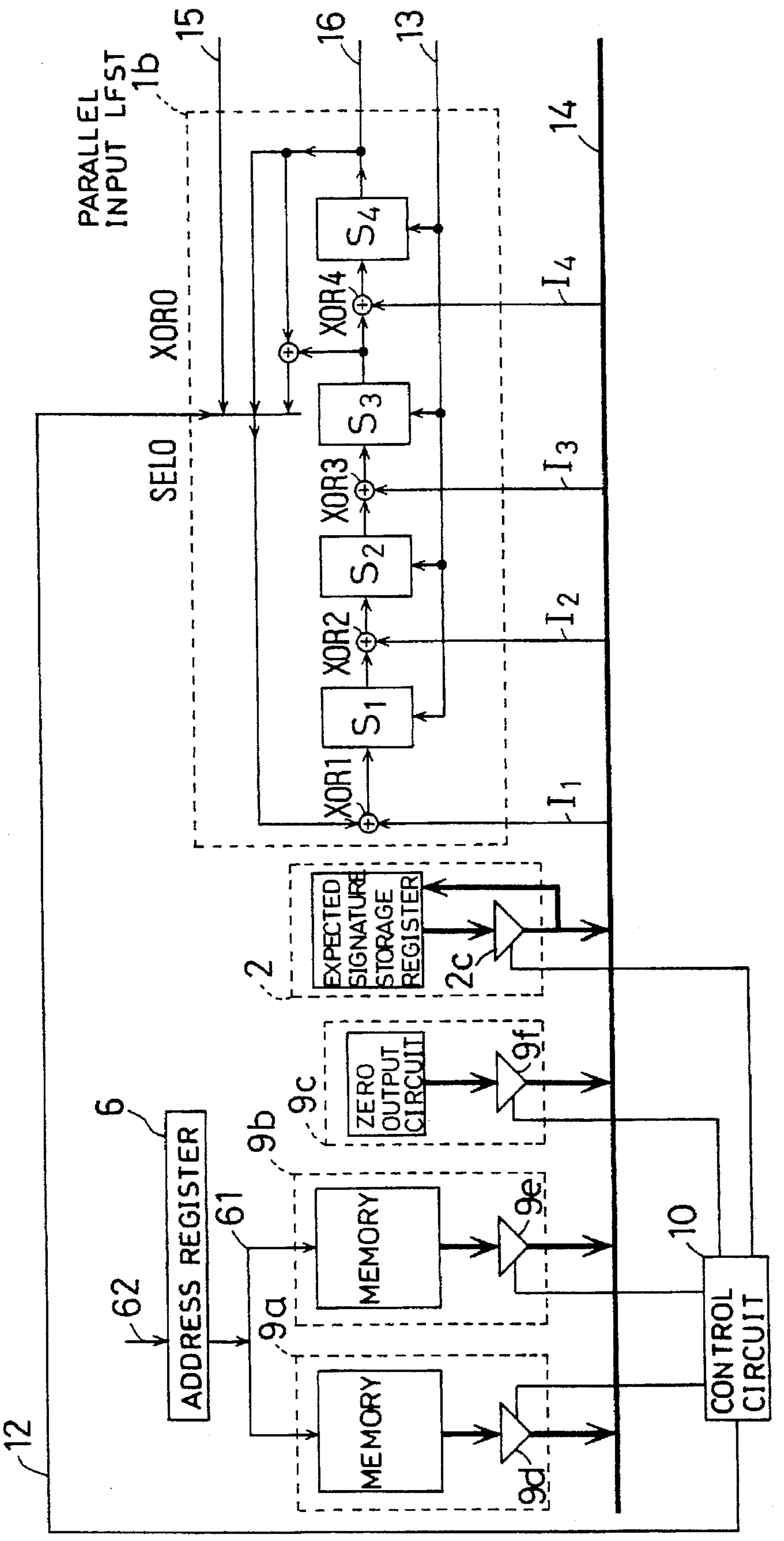
FIG. 7 is view showing the structure of a specific test circuit of an integrated semiconductor device in a fourth embodiment of the present invention.

A description will be given next to a fourth embodiment of the present invention. Briefly, the present embodiment is constituted so that the result of comparison/judgment is outputted to the outside by providing a parallel-input LFSR with additional hardware. FIG. 7 is a view showing the entire test circuit of an integrated semiconductor device in the fourth embodiment.

The fourth embodiment is different from the above second embodiment shown in FIG. 4 in that, to connect the parallel-input LFSR 1b to a scan path in the chip, the feedback information selector (feedback information generating means) SEL0 is composed of a 3-input selector so that a scan-in signal 15, in addition to the output from the final-stage register S4 and to the output from the 2-input exclusive-OR gate (feedback information generating means) XORO, is inputted thereto, while the output from the final-stage register S4 is connected as a scan-out signal 16 to the scan path. The fourth embodiment is also different from the second embodiment in that a zero output circuit 9c is provided as a zero output means for supplying "0" as parallel data to each of the registers S1 to S4 of the parallel-input LFSR 1b and an output buffer 9f is disposed in the zero output circuit 9c so that the output from the zero output circuit 9c to the data bus 14 is controlled by the control circuit 10.

Accordingly, in the scanning operation of the present embodiment, the zero output circuit 9c outputs "0" to the data bus 14 so that the value of 0 is supplied to the second inputs of the 2-input exclusive-OR gates XOR1 to XOR4. As a result, the values of the registers S1 to S4 in the previous stages are shifted to the right by 1 bit in step with the clock, so that the result of comparison by the parallel-input LFSR 1b is outputted as the scan-out signal. Hence, the result of comparison can be observed outside the chip.

Not only in the case of scanning out the result of comparison, but also in the scanning operation, sequential signals supplied as the scan-in signals are selected by the 3-input selector SEL0 and successively stored in the parallel-input LFSR 1b in step with the clock. Consequently, the initial value (seed) in data compression is designated as the scan-in signal so that the scan-in signal is scanned in at the initiation of testing the integrated semiconductor device. If the plurality of memories to be tested have different capacities or if different sets of data are written in the memories having the same capacity, an initial value from which the same compressed signature can be obtained is preliminarily obtained so that it is scanned in to each memory to be tested. Therefore, it is possible for all the memories to diagnose themselves with only one expected signature.

Thus, in the present embodiment, the single parallel-input LFSR can implement the functions of compressing sequential outputs, comparing the compressed value with the expected value, and operating as a scan (shift) register.

Although the 2-input exclusive-OR gates XOR1, XOR2, XOR3, and XOR4 have outputted the signals 11 to the diagnostic register 7 and to the normal/abnormal judging circuit 8, it is also possible to perform shifting operation in the comparison/judgment cycle, instead. In this case, the outputs from the 2-input exclusive-OR gates indicating the result of comparison are stored in the registers in respective stages so that the outputs from the registers are stored as the result of normal/abnormal judgment in the diagnostic register 7. As for the normal/abnormal judging circuit 8, it outputs "1" indicating that the memory is normal if all the outputs 11 from the registers in respective stages have the value of 0, while it outputs "0" indicating that the memory is not normal if at least one of the outputs 11 has the value of 1, thereby properly judging whether or not the memory is normal.

The present invention is not limited to the above embodiments, either. That is, in testing a memory, if sets of data are fixed and the order of reading the sets of data is always the same as in a ROM or PLA, the expected signature is uniquely determined. Even in a ROM, if the order of writing sets of data therein and reading the sets of data therefrom for a test is always the same, the expected signature is also uniquely determined. Even in a programmable ROM or PLA, a test with the test circuit can be performed by rewriting the expected signature as well in programming. Although the parallel-input LFSR is disposed on the same chip as the memory under test, it will be appreciated that the configuration is not limited thereto.

We claim:

1. A test circuit for testing an integrated semiconductor device, said test circuit comprising:

means for storing an expected compressed value;

a calculating circuit for compressing sequential sets of parallel data and obtaining a compressed value and also, for comparing said expected compressed value with a compressed value obtained from said sequential sets of parallel data;

an information collecting means for supplying, to said calculating circuit, sequential sets of parallel data obtained from an integrated semiconductor device under test and for supplying to said calculating circuit the compressed valued obtained by said calculating means and the expected compressed value stored in said expected compressed value storing means, wherein said calculating circuit functions as a comparing means for comparing said obtained compressed value with the expected compressed value, and also for compressing data from said integrated semiconductor device under test during a normal operation of the integrated semiconductor device.

2. The test circuit according to claim 1, wherein said calculating circuit and said information collecting means form a parallel-input linear feedback shift register.

3. The test circuit according to claim 2, wherein the parallel-input linear feedback shift register comprises:

a plurality of registers;

a plurality of 2-input exclusive-OR gates placed in the stages previous to said respective registers; and a feedback information generating means for generating feedback information from the output of the register in the final stage and from the output of the register in a specified middle stage, each of said registers receiving the output from the 2-input exclusive-OR gate in its previous stage, the first input of each of the 2-input exclusive-OR gates except the 2-input exclusive-OR gate placed in the stage previous to the register in the first stage being supplied with the output from the register in its previous stage, the first input of the 2-input exclusive-OR gate placed in the stage previous to the register in the first stage being supplied with the output from a feedback information selecting means, the calculating circuit is composed of the plurality of 2-input exclusive-OR gates provided in said parallel-input linear feedback shift register, the information collecting means consists of:

a feedback information selecting means for selecting, based on a control signal, either the output from the feedback information generating means or the output from the register in the final stage of said parallel-input linear feedback shift register; and an input selecting means for selecting, based on the control signal, either the parallel data or the expected compressed value stored in the expected compressed value storing means as data to be supplied to the second input of each of the registers of said parallel-input linear feedback shift register.

4. The test circuit according to claim 1, 2, or 3, wherein the integrated semiconductor device to be tested is a memory.

5. The test circuit according to claim 1, 2, or 3, wherein the integrated semiconductor device to be tested is an internal functional block.

6. The test circuit according to claim 3, wherein the input selecting means is composed of a 2-input multiplexer.

7. The test circuit according to claim 3, further comprising a single data bus, wherein each of the 2-input exclusive-OR gates of the parallel-input linear feedback shift register is connected directly to said data bus, while the integrated semiconductor device and the expected compressed value storing means are connected to said data bus via their respective output buffers, and the input selecting means is comprised of a control circuit for controlling the respective output buffers of said integrated semiconductor device and of said expected compressed value storing means so that either one of the sets of data from said integrated semiconductor device and from said expected compressed value storing means is outputted to said data bus.

8. The test circuit according to claim 7, wherein a plurality of integrated semiconductor devices are connected to the data bus.

9. The test circuit according to claim 3 or 7, wherein based on the control signal, the input selecting means selects the parallel data from the integrated semiconductor device in a compression cycle for compressing the parallel data from the integrated semiconductor device, while it selects the expected compressed value from the expected compressed value storing means for comparing the obtained compressed value with the expected compressed value for judging integrated semiconductor device.

10. The test circuit according to claim 3, wherein the expected compressed value storing means preliminarily rotates the expected compressed value by 1 bit in the shifting direction of the parallel-input linear feedback shift register and then stores it.

11. The test circuit according to claim 3, further comprising a single data bus, wherein the parallel-input linear feedback shift register comprises an output buffer for connecting the outputs from the individual registers and the output from the feedback information selecting means to said data bus so that the first input of each of the 2-input exclusive-OR gates is connected directly to said data bus, that the first input of each of the 2-input exclusive-OR gates except the 2-input exclusive-OR gate placed in the stage previous to the register in the first stage is supplied with the output from the register in its previous stage via said output buffer and via said data bus, and that the first input of the 2-input exclusive-OR gate placed in the stage previous to the register in the first stage is supplied with the output from said feedback information selecting means via said output buffer and via said data bus.

12. The test circuit according to claim 11, further comprising an additional data bus, wherein the parallel input linear feedback shift register comprises an additional output buffer for connecting the outputs from the individual registers and the output from the feedback information selecting means to said additional data bus so that the second input of each of the 2-input exclusive-OR gates is connected directly to said data bus, that the second input of each of the 2-input exclusive-OR gates except the 2-input exclusive-OR gate placed in the stage previous to the register in the first stage is supplied with the output from the register in its previous stage via said additional output buffer and said additional data bus, and that the second input of the 2-input exclusive-OR gate placed in the stage previous to the register in the first stage is supplied with the output from said feedback information selecting means via said additional output buffer and via said additional data bus.

13. The test circuit according to claim 12, wherein the integrated semiconductor device and the expected compressed value storing means are connected to each of the data bus and additional data bus, each of said integrated semiconductor devices and expected compressed value storing means is internally provided with an output buffer, and the input selecting means is composed of a control circuit for controlling the output buffers provided in said integrated semiconductor device and in the expected compressed value storing means, respectively, and the output buffers provided in said parallel-input linear feedback shift register so that either one of the two data buses is used for compression using the parallel-input linear feedback shift register, while data is outputted onto the other data bus from either one of the integrated semiconductor device and expected compressed value storing means which are connected to the other data bus.

14. The test circuit according to claim 12, wherein the integrated semiconductor device is connected to each of the data bus and additional data bus, each of said integrated semiconductor devices is internally provided with an output buffer, the input selecting means is composed of a control circuit for controlling the output buffers provided in said integrated semiconductor devices, respectively, and the output buffers provided in said parallel-input linear feedback shift register so that a set of data is outputted onto one of the data buses from the integrated semiconductor device connected to one of the data buses, while another set of data is outputted onto the other data bus from the integrated semiconductor device connected to the other data bus, the two sets of data outputted onto said two data buses being compared with each other at the 2-input exclusive-OR gates of the parallel-input linear feedback shift register.

15. The test circuit according to claim 3 or 7, further comprising, a normal/abnormal judging means for receiving, as its inputs, the outputs from the 2-input exclusive-OR gates of the parallel-input linear feedback shift register, judging whether or not the integrated semiconductor device is normal from the values of the inputs, and outputting the result of judgment.

16. The test circuit according to claim 3 or 7, further comprising, a diagnostic register for receiving, as its inputs, the outputs from the 2-input exclusive-OR gates of the parallel-input linear feedback shift register and storing the contents of the inputs, while outputting the contents of the inputs.

17. The test circuit according to claim 7, wherein scan-in information is inputted to the feedback information selecting means, said feedback information selecting means selects said scan-in information in scanning operation, and the output from the register in the final stage of the parallel-input linear feedback shift register is connected as scan-out information to a scan path, said test circuit further comprising, a zero output means for supplying zero as the parallel data to each of the registers of said parallel-input linear feedback shift register in the scanning operation so that the outputs from all the registers of said parallel-input linear feedback shift register can be observed from the outside.

18. The test circuit according to claim 14, further comprising, a normal/abnormal judging means for receiving the result of comparing the two sets of data at the 2-input exclusive-OR gates of the parallel-input linear feedback shift register, judging whether or not the two sets of data match, and outputting the result of judgment.

19. A method for testing an integrated semiconductor device, comprising the steps of:

repeatedly compressing sequential sets of parallel data by reading sequential sets of data from the integrated semiconductor device in accordance with the same sequential addresses as supplied in generating an expected compressed value that has previously been obtained, while inputting the sequential sets of read data in parallel to the individual registers of a parallel-input linear feedback shift register, and shifting the sets of inputted data, so that the outputs from the individual registers at the time of compressing the final set of parallel data are obtained as the compressed value of the parallel data;

then supplying the first input of a 2-input exclusive-OR gate placed in the stage previous to the register in the first stage with the output from the register in the final stage and supplying the first inputs of 1-input exclusive-OR gates placed in the stages previous to the respective registers except the register in the first stage with the outputs from the registers in their respective previous stages;

inputting the expected compressed value to the second input of each of the 2-input exclusive-OR gates of said parallel-input linear feedback shift register; and comparing the compressed value of the parallel data with the expected compressed value bit by bit correspondingly at the 2-input exclusive-OR gates and judging, based on the result of comparison, whether or not the integrated semiconductor device under test is normal.

20. The method of testing according to claim 19, wherein any one of a plurality of integrated semiconductor devices is connected to a single data bus via an output buffer, sequential sets of data are read from the connected integrated semiconductor device via said data bus, the sequential sets of read data are compressed so as to obtain the compressed value, the obtained compressed value is compared with the expected compressed value, another one of the plurality of integrated semiconductor devices is connected to the data bus via the output buffer, sequential sets of data are read from the connected integrated semiconductor device via said data bus, the sequential sets of read data are compressed so as to obtain the compressed value, and the obtained compressed value is compared with the expected compressed value, said procedures being repeatedly performed until the testing of all the integrated semiconductor devices is completed.

21. The method of testing according to claim 19, wherein while repeatedly compressing the sequential sets of data from the integrated semiconductor device by means of the parallel-input linear feedback shift register, each time the sequential sets of data are compressed, middle compression information consisting of the output from any one of the registers except the register in the final stage of said parallel-input linear feedback shift register and of feedback information is stored or inputted, via a data bus, as test data for the integrated semiconductor device connected to the data bus.

22. The method of testing according to claim 19, wherein an initial value is scanned in to the parallel-input linear feedback shift register before initiating a test.

23. The method of testing according to claim 22, wherein the integrated semiconductor device to be tested is composed of a plurality of memories, said memories have different capacities and different data to be written or having been written therein, and the initial value to be scanned in to the parallel-input linear feedback shift register has been previously obtained so as to equalize the expected compressed values obtained by reading the respective sequential sets of data from said memories.

24. The method of testing according to claim 22, wherein the integrated semiconductor device to be tested is composed of a plurality internal functional blocks, said internal functional blocks having different functions or different sequential inputs to be supplied thereto, and the initial value to be scanned in to the parallel-input linear feedback shift register has been previously obtained so as to equalize the expected compressed values obtained from the respective outputs from the internal functional blocks corresponding to said respective sequential inputs.

* * * * *

UNITED STATES PATENT AND TRADEMARK OFFICE

CERTIFICATE OF CORRECTION

PATENT NO. : 5,631,913
DATED : May 20, 1997
INVENTOR(S) : Toshinori Maeda

It is certified that error appears in the above-identified patent and that said Letters Patent is hereby corrected as shown below:

Column 21,
Line 18, change "1-input" to -- 2-input --.

Signed and Sealed this

Fourteenth Day of May, 2002

Attest:

JAMES E. ROGAN

*Attesting Officer*

*Director of the United States Patent and Trademark Office*